United States Patent
Fox, III (10) Patent No.: US 10,236,206 B2
(45) Date of Patent: Mar. 19, 2019

(54) INTERCONNECTS WITH HYBRID METALLIZATION

(71) Applicant: GLOBALFOUNDRIES Inc., Grand Cayman (KY)

(72) Inventor: Robert J. Fox, III, Greenfield Center, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/640,748

(22) Filed: Jul. 3, 2017

(65) Prior Publication Data

US 2019/0006234 A1    Jan. 3, 2019

(51) Int. Cl.
    *H01L 23/52*      (2006.01)
    *H01L 21/768*      (2006.01)
    *H01L 23/532*      (2006.01)

(52) U.S. Cl.
    CPC .... *H01L 21/76843* (2013.01); *H01L 21/7685* (2013.01); *H01L 21/76865* (2013.01); *H01L 21/76874* (2013.01); *H01L 21/76876* (2013.01); *H01L 21/76882* (2013.01); *H01L 21/76883* (2013.01); *H01L 23/53238* (2013.01); *H01L 21/76807* (2013.01)

(58) Field of Classification Search
CPC ........... H01L 21/76843; H01L 21/7685; H01L 21/76865; H01L 21/76874; H01L 21/76876; H01L 21/76882; H01L 21/76883; H01L 23/53238; H01L 21/76807
See application file for complete search history.

(56) References Cited

U.S. PATENT DOCUMENTS

| | | | | |
|---|---|---|---|---|
| 6,028,362 A | * | 2/2000 | Omura | H01L 21/76807 257/751 |
| 7,223,654 B2 | * | 5/2007 | Yang | H01L 23/5223 257/E21.008 |
| 8,227,344 B2 | | 7/2012 | Selsley et al. | |
| 8,962,473 B2 | | 2/2015 | Kuo et al. | |
| 9,171,801 B2 | | 10/2015 | Bao et al. | |
| 2004/0262764 A1 | * | 12/2004 | Gambino | H01L 21/76807 257/758 |
| 2010/0314764 A1 | | 12/2010 | Yang et al. | |

(Continued)

*Primary Examiner* — Victor A Mandala
*Assistant Examiner* — Colleen E Snow
(74) *Attorney, Agent, or Firm* — Thompson Hine LLP; Anthony Canale (57) ABSTRACT

Structures for interconnects and methods for forming interconnects. A dual-damascene opening is formed in a dielectric layer and a first liner is formed on the dielectric layer at one or more sidewalls of the dual-damascene opening. A first conductor layer is formed in a portion of the dual-damascene opening. The first liner is removed from the one or more sidewalls of the dual-damascene opening vertically between the first conductor layer and a top surface of the dielectric layer. After the first liner is removed, a second liner is formed on the dielectric layer at the one or more sidewalls of the dual-damascene opening between the first conductor layer and the top surface of the dielectric layer. A second conductor layer is formed in the dual-damascene opening between the first conductor layer and the top surface of the dielectric layer. The first and second liner materials differ in composition.

18 Claims, 5 Drawing Sheets

(56) References Cited

U.S. PATENT DOCUMENTS

| | | | |
|---|---|---|---|
| 2013/0270703 A1* | 10/2013 | Zierath | H01L 21/76877 257/751 |
| 2014/0183739 A1* | 7/2014 | Li | H01L 21/76871 257/751 |
| 2014/0332963 A1 | 11/2014 | Filippi et al. | |
| 2017/0092589 A1* | 3/2017 | Chen | H01L 23/53238 |
| 2017/0243830 A1* | 8/2017 | Murray | H01L 23/53238 |
| 2018/0108610 A1* | 4/2018 | Yang | H01L 23/5283 |

* cited by examiner

INTERCONNECTS WITH HYBRID METALLIZATION

BACKGROUND

The present invention relates to integrated circuits and semiconductor device fabrication and, more specifically, to structures for interconnects and methods for forming interconnects.

An interconnect structure may be used to electrically connect device structures fabricated on a substrate by front-end-of-line (FEOL) processing. A back-end-of-line (BEOL) portion of the interconnect structure includes metallization formed using a dual damascene process in which via openings and trenches etching in a dielectric layer are simultaneously filled with metal to create a metallization level. The lowest metal level of the BEOL interconnect structure may be coupled with the device structures by features, such as contacts, formed prior to BEOL processing using metallization formed by middle-of-line (MOL) processing.

Improved structures for interconnects and methods for forming interconnects are needed.

SUMMARY

According to an embodiment of the invention, a method of forming an interconnect structure includes forming a dual-damascene opening in a dielectric layer, forming a first liner composed of a first material on the dielectric layer at one or more sidewalls of the dual-damascene opening, and forming a first conductor layer in a portion of the dual-damascene opening. The method further includes removing the first liner from the one or more sidewalls of the dual-damascene opening vertically between the first conductor layer and a top surface of the dielectric layer and, after the first liner is removed, forming a second liner composed of a second material on the dielectric layer at the one or more sidewalls of the dual-damascene opening between the first conductor layer and the top surface of the dielectric layer. A second conductor layer is formed in the dual-damascene opening between the first conductor layer and the top surface of the dielectric layer. The second material of the second liner is different in composition from the first material of the first liner.

According to an embodiment of the invention, an interconnect structure includes a dielectric layer having a top surface and a dual-damascene opening with one or more sidewalls. The interconnect structure further includes a first conductor layer in a portion of the dual-damascene opening, a second conductor layer arranged in the dual-damascene opening between the first conductor layer and the top surface of the dielectric layer, a first liner arranged between the first conductor layer and the dielectric layer at the one or more sidewalls of the dual-damascene opening, and a second liner arranged between the second conductor layer and the dielectric layer at the one or more sidewalls of the dual-damascene opening. The second liner is composed of a second material different in composition from a first material from which the first liner is composed.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
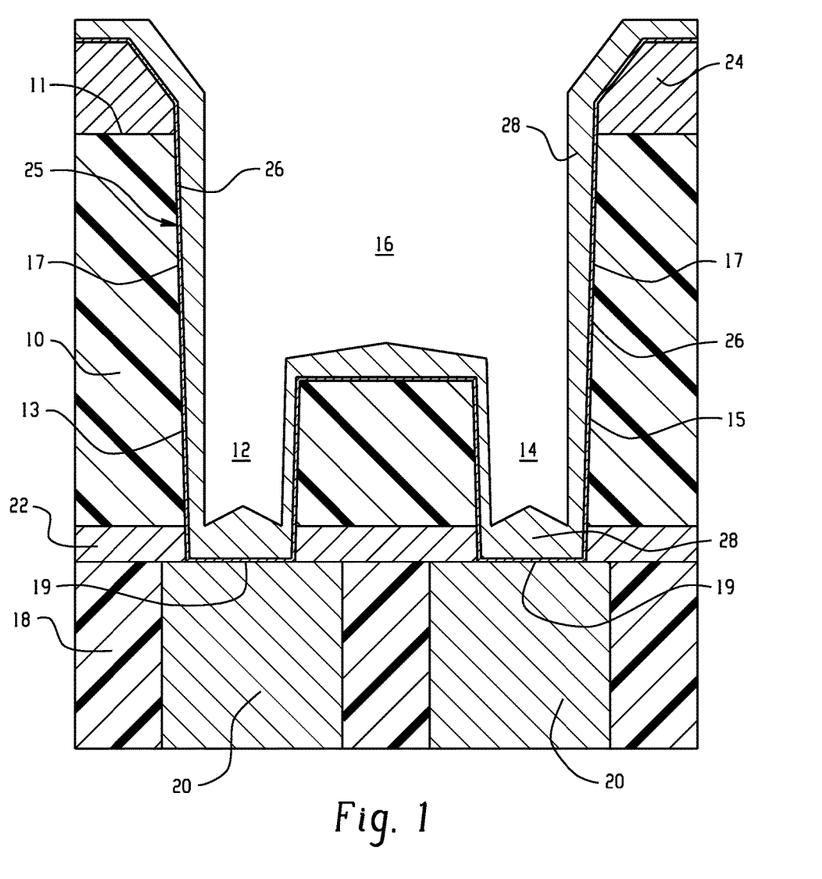
FIGS. 1-5 are cross-sectional views of a structure at successive fabrication stages of a processing method in accordance with embodiments of the invention.

With reference to FIG. 1 and in accordance with an embodiment of the invention, a dielectric layer 10 may be processed by back-end-of-line (BEOL) processing to form a metallization level of an interconnect structure. The dielectric layer 10 may be composed of an electrical insulator, such as silicon dioxide ($SiO_2$) or another suitable dielectric material. The dielectric layer 10 may be patterned by photolithography and etching to form a dual-damascene opening 25 that includes via openings 12, 14 and a trench 16 that overlaps with the via openings 12, 14. To that end, a resist layer may be applied, exposed to a pattern of radiation projected through a photomask, and developed to form a corresponding pattern of openings situated at the intended locations for the via openings 12, 14. The patterned resist layer is used as an etch mask for a dry etching process, such as a reactive-ion etching (ME), that removes portions of the dielectric layer 10 to form the via openings 12, 14. Another resist layer may be applied, exposed to a pattern of radiation projected through a photomask, and developed to form an opening situated at the intended location for the trench 16. The patterned resist layer is used as an etch mask for a dry etching process, such as a reactive-ion etching (RIE), that removes portions of the dielectric layer 10 to form the trench 16. Each etching process may be conducted in a single etching step or multiple etching steps with different etch chemistries. As components of the dual-damascene opening 25, the via openings 12, 14 may be formed before the trench 16 is formed or, alternatively, the trench 16 may be formed before the via openings 12, 14 are formed. A hardmask 24 comprised of one or more layers is located on a top surface 11 of the dielectric layer 10, and is used as an etch mask when forming the trench 16.

The dielectric layer 10 is located on an underlying metallization level that includes a dielectric layer 18, conductive features 20 that are arranged in the dielectric layer 10, and a capping layer 22. The via opening 12 has one or more sidewalls 13 that extend to one of the conductive features 20. The via opening 14 has one or more sidewalls 15 that extend to another of the conductive features 20. The trench 16 has one or more sidewalls 17 that extend from a top surface 11 of the dielectric layer 10 to merge with the sidewalls 13, 15 of the via openings 12, 14. The via openings 12, 14 and trench 16 may penetrate through the dielectric layer 10 that is less than the thickness of dielectric layer 10 or completely through the thickness of dielectric layer 10 and the capping layer 22.

A liner layer 26 of a given thickness is conformally deposited on the respective sidewalls 13, 15, 17 of the via openings 12, 14 and trench 16, and on the conductive features 20 at the bottoms of the via openings 12, 14, which collective constitute the bottom of the dual-damascene opening 25. The liner layer 26 also deposits in the field area on the top surface 11 of the dielectric layer 10 on the hardmask 24. The liner layer 26 may be composed of a material characterized by material properties making it capable of enhancing the reflow of a conductor, such as copper (Cu). In an embodiment, the liner layer 26 may be composed of ruthenium (Ru) or a layered combination that includes Ru and one or more additional materials, such as tantalum nitride (TaN) and/or tantalum (Ta), with Ru as the top most layer in the layered combination. The liner layer 26 may be deposited by chemical vapor deposition (CVD), atomic layer deposition (ALD), by physical vapor deposition (PVD) with, for example, a sputter-assisted process, or by a combination of these methods.

A seed layer 28 is deposited on the liner layer 26 covering the respective sidewalls 13, 15 of the via openings 12, 14 and the sidewalls 17 of the trench 16, and on the conductive features 20 at the bottoms 19 of the via openings 12, 14. The seed layer 28 also deposits in the field area on the liner layer 26 covering the top surface 11 of the dielectric layer 10. The seed layer 28 may be composed of a conductor with a high electrical conductivity, such as copper (Cu), deposited by chemical vapor deposition (CVD) or PVD.

Figure 2:
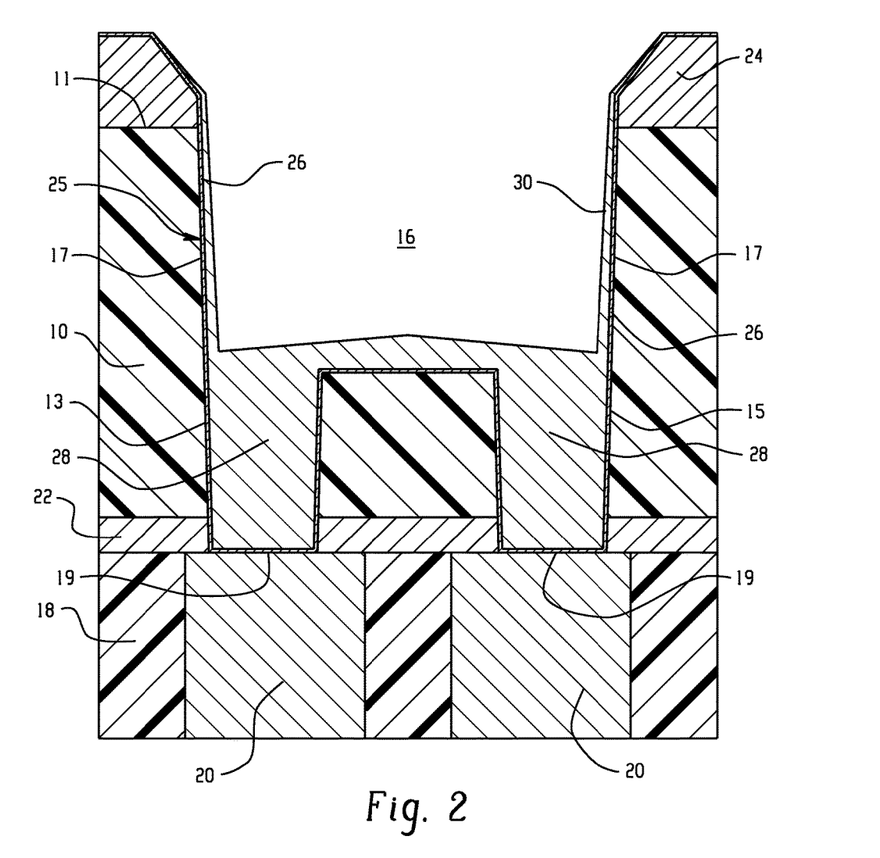

With reference to FIG. 2 in which like reference numerals refer to like features in FIG. 1 and at a subsequent fabrication stage of the processing method, a thermal process may applied to cause the conductor in the seed layer 28 deposited on the respective sidewalls 13, 15, 17 and in the field area on the top surface 11 of the dielectric layer 10 to reflow. The conductor of the seed layer 28 is transported to the bottoms 19 of the via openings 12, 14 (FIG. 1), which increases the thickness of the seed layer 28 inside the via openings 12, 14. The thermal process may comprise annealing or heating the seed layer 28 at an elevated temperature, such as a temperature greater than 250° C. or a temperature in a range of 250° C. to 400° C. The thermal process may be conducted following deposition and/or during deposition. The thermal process accelerates conductor surface diffusion of the material of the seed layer 28 and increases the fill depth (i.e., the thickness) upward from the bottoms 19 of the via openings 12, 14. The reflow is characterized as partial because, despite the thermally-induced transport of conductor from the field area into the trench 16, a residual thickness of the seed layer 28 remains in the field area and also on the sidewalls 13, 15, 17 following the thermal anneal. The reflow is enhanced because the liner layer 26, or the topmost layer of a multiple layers constituting the liner layer 26, is composed of a material, such as ruthenium (Ru), that promotes reflow.

The conductor deposition and partial reflow cycle may be repeated to increase the thickness of the seed layer 28 inside the via openings 12, 14 upward from their respective bottoms 19 to achieve a targeted thickness. Specifically, one or more additional iterations of depositing a seed layer 28 and reflowing the conductor of the seed layer 28 toward the respective bottoms 19 of the via openings 12, 14. As a result of the repetition of the conductor deposition and partial reflow process, the thickness of conductor incrementally rises inside the via openings 12, 14 with each cycle upward from their respective bottoms 19 toward the trench 16.

Following the final deposition/partial reflow cycle, at least a portion of the open space inside the trench 16 above the top surface of the seed layer 28 is unfilled. In the representative embodiment, the thickness of the seed layer 28 is slightly greater than the depth of the via openings 12, 14 such that a section of the seed layer 28 covers the section of the dielectric layer 10 between the via openings 12, 14. Alternatively, the thickness of the seed layer 28 may be equal to, or slightly less, than the depth of the via openings 12, 14. Regardless of its thickness, the seed layer 28 primarily fills the via openings 12, 14. A residual layer 30 of conductor from the reflowed seed layer 28 may be located on the liner layer 26 covering the sidewalls 17 of the trench 16 and may also be present on the field region on the top surface 11 of the dielectric layer 10. The material of the residual layer 30 may be oxidized due to vacuum breaks between different tool sets.

Figure 3:
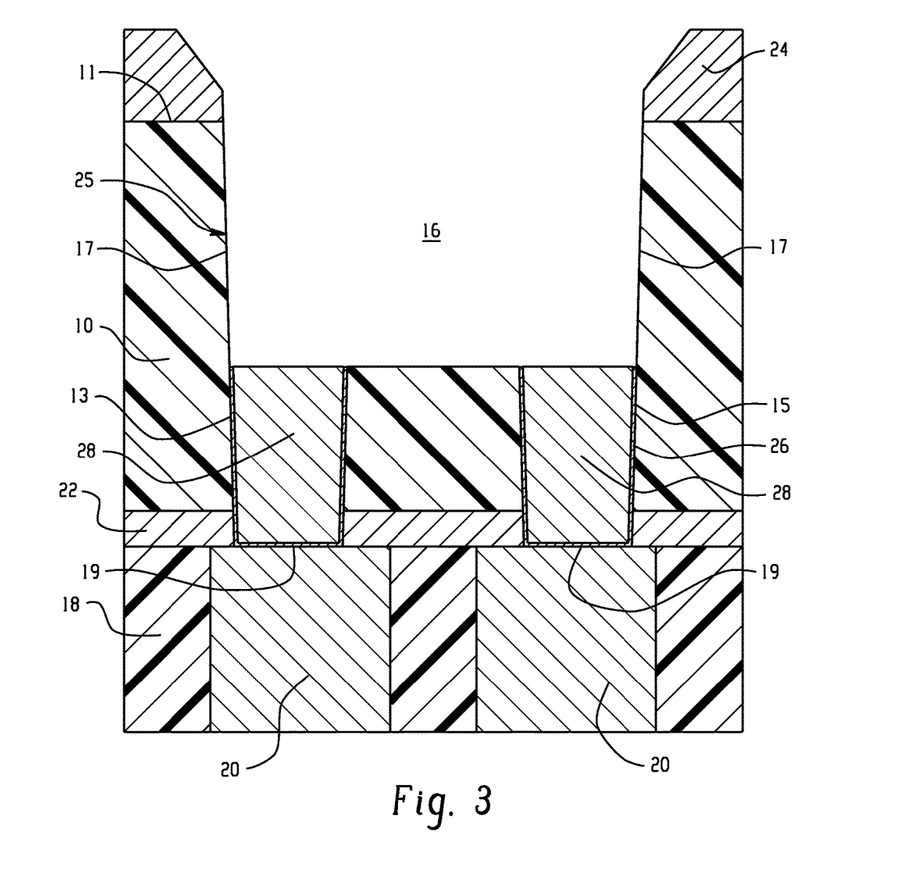

With reference to FIG. 3 in which like reference numerals refer to like features in FIG. 2 and at a subsequent fabrication stage of the processing method, the residual layer 30 and the liner layer 26 are removed from the sidewalls 17 of the trench 16 above the level of the seed layer 28 to expose the dielectric material of the dielectric layer 10 at the sidewalls 17 of the trench 16. The liner layer 26 and the residual layer 30 are also removed from the field region. In an embodiment, one or more sputtering chemically-reactive processes may be used to remove the residual layer 30 and the liner layer 26 from the sidewalls 17 of the trench 16. The seed layer 28 remaining in the via openings 12, 14 may be slightly thinned when the residual layer 30 is removed.

The conductor of the seed layer 28 inside the via openings 12, 14 is separated from the dielectric material of the dielectric layer by the liner layer 26. In the representative embodiment, the seed layer 28 and the underlying liner layer 26 are removed from the section of dielectric layer 10 arranged between via opening 12 and via opening 14, and the seed layer 28 inside the via openings 12, 14 has a top surface that is coextensive with the trench 16. In alternative embodiments, the top surface of the seed layer 28 may be recessed into the via openings 12, 14 or may project above the via openings 12, 14 into the trench 16. In the former embodiment, a portion of each of the via openings 12, 14 is unfilled above the height of the seed layer 28. In the latter embodiment, sections of the seed layer 28 and the liner layer 26 may cover the section of dielectric layer 10 arranged between via opening 12 and via opening 14. In any arrangement, the via openings 12, 14 are primarily filled by conductor from the seed layer 28.

Figure 4:
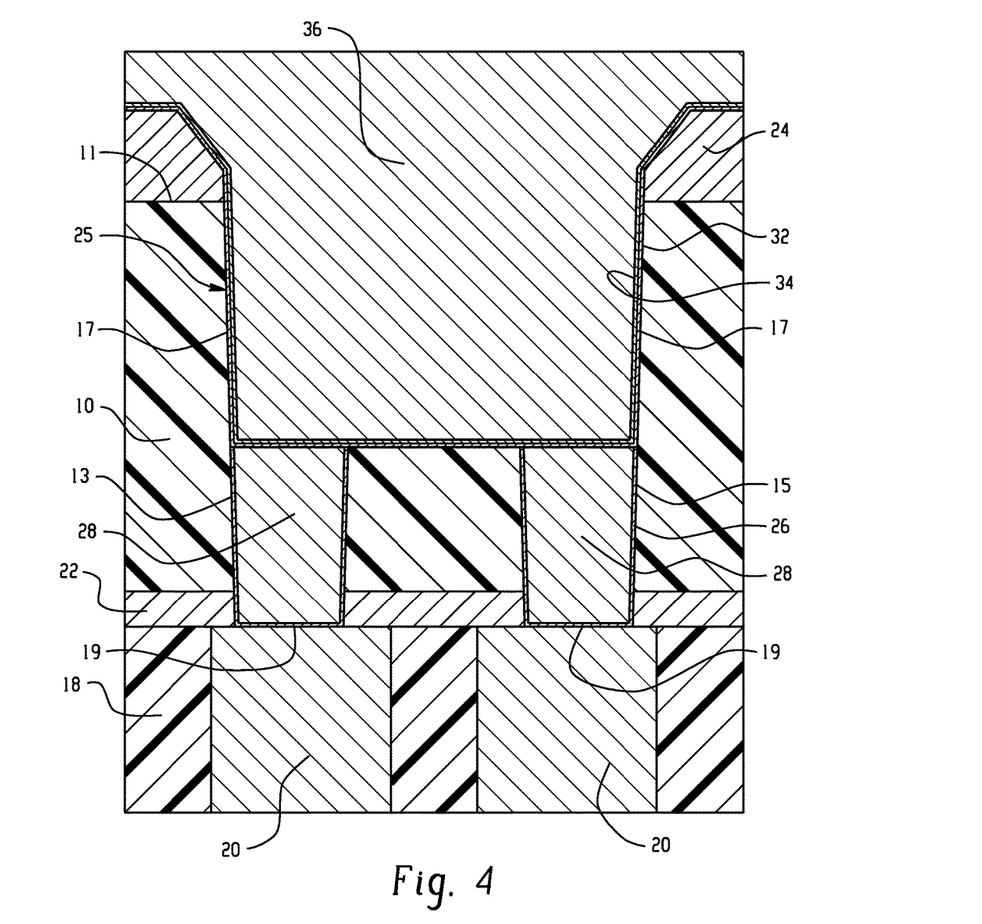

With reference to FIG. 4 in which like reference numerals refer to like features in FIG. 3 and at a subsequent fabrication stage of the processing method, a barrier layer 32 and a liner layer 34 of respective given thicknesses are conformally deposited on the respective sidewalls 17 of the trench 16 and on the seed layer 28. The barrier layer 32 and liner layer 34 also deposit in the field area on the top surface 11 of the dielectric layer 10 on the hardmask 24. The liner layer 34, which is the topmost layer, may be composed of a conductor, such as cobalt (Co). The barrier layer 32 may be composed of one or more layers of conductor, such as titanium (Ti), titanium nitride (TiN), tantalum (Ta), tantalum nitride (TaN), a layered stack of the conductive materials (e.g., a bilayer of Ta and TaN), or a combination of these conductors. The barrier layer 32 and the liner layer 34 are free of ruthenium (Ru). The barrier layer 32 and the liner layer 34 may be deposited by physical vapor deposition (PVD) with, for example, a sputter-assisted process.

A seed layer (not shown) and a conductor layer 36 are deposited on the liner layer 34. The seed layer and conductor layer 36 also deposit in the field area on the top surface 11 of the dielectric layer 10 on the liner layer 34. The seed layer may be composed of a conductor with a high electrical conductivity, such as copper (Cu), deposited by CVD or PVD. The conductor layer 36 is deposited using a deposition process, such as electroless deposition, that differs from the deposition (and reflow) process used to form the seed layer 28. Respective sections of the liner layer 34 and the barrier layer 32 are arranged in a layer stack between the conductor layer 36 and the seed layer 28.

Figure 5:
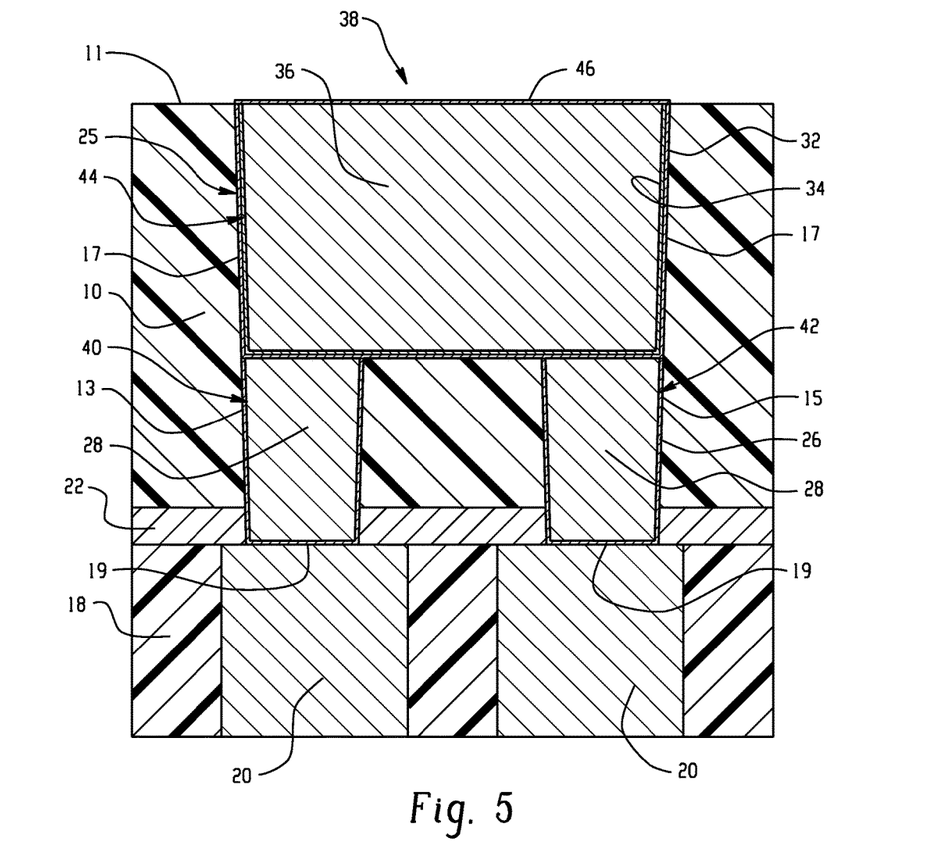

With reference to FIG. 5 in which like reference numerals refer to like features in FIG. 4 and at a subsequent fabrication stage, the conductor layer 36, its seed layer, the liner layer 34, and the barrier layer 32 are removed from the field area on the top surface 11 of dielectric layer 10 by planarization, such as with one or more chemical mechanical polishing (CMP) processes. The hardmask 24 is removed by the CMP processes, and the dielectric layer 10 and the conductor layer 36 are planarized by the CMP processes. Material removal during each CMP process combines abrasion and an etching effect that polishes the targeted material and may be conducted with a commercial tool using polishing pads and slurries selected to polish the targeted material(s). Because the barrier layer 32 and the liner layer 34 are free of ruthenium, a CMP process to remove ruthenium is not required, which may avoid polishing artifacts such as ripout, scratching and voiding—as well as loss of global planarity due to excessive dishing and erosion—associated with ruthenium when subjected to CMP processes.

A hybrid conductive feature 38 includes, as contributing components, a conductive feature 40 inside the via opening 12 and a conductive feature 42 inside the via opening 14 that each include the conductor from the seed layer 28, as well as a conductive feature 44 inside the trench 16 that includes conductor from the conductor layer 36. Depending on the thickness of the seed layer 28 relative to the height of the via openings 12, 14, each of the conductive features 40, 42, 44 may include a contribution from the seed layer 28 and a contribution from the conductor layer 36. The hybrid conductive feature 38 may have a seamless and void-free construction. The conductive features 40, 42, 44 are embedded in the dielectric layer 10 after planarization, and the conductive features 40, 42 establish a vertical interconnection between the conductive feature 44 and the conductive features 20.

A capping layer 46 may be formed on the conductive feature 44. In an embodiment, the capping layer 46 may be composed of, for example, cobalt (Co) that is deposited using a deposition process, such as chemical vapor deposition (CVD) or electroless deposition, that selectively deposits cobalt only on the conductive feature 44 and not on the top surface 11 of the dielectric layer 10.

The conductive features 40, 42, 44 feature a hybrid metal liner structure comprised of the liner layers 26, 34 that promotes a low-resistance, high-reliability interconnect. The filling of the via openings 12, 14 with reflowed conductor from the seed layer 28, which is promoted by the material of the liner layer 26, reduces the aspect ratio of height-to-width for the subsequent formation of the conductor layer 36 that primarily fills the trench 16. In that regard, the filling of the trench 16 is effectively transformed into a single-damascene metallization process and is associated with low-cost dual-damascene patterning to form the via openings 12, 14 and trench 16 and with a reduced risk of forming voids in the conductor layer 36. The absence of ruthenium in the liner layer 34 may improve downstream processing by eliminating issues associated with a ruthenium liner, such as scratches, ripout, voiding, and excessive dishing and erosion. On the other hand, the presence of a different material, such as cobalt, in the liner layer 34 instead of ruthenium may promote downstream processing. The liner layer 34 is also compatible with the formation of a capping layer 46 that is also comprised of cobalt for reliability enhancement. The hybrid conductive feature 38 with the compound metal liner structure of cobalt and ruthenium may exhibit enhanced metal resistance-capacitance performance and reduced resistance for the conductive features 40, 42 in the via openings 12, 14.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an interconnect structure, the method comprising:
    forming a dual-damascene opening in a dielectric layer;
    forming a first liner composed of a first material on the dielectric layer at one or more sidewalls of the dual-damascene opening;
    filling a lower portion of the dual-damascene opening with a first conductor layer by a conductor deposition and reflow process such that an upper portion of the dual-damascene opening is unfilled by the first conductor layer;
    removing the first liner from the one or more sidewalls of the dual-damascene opening vertically between the first conductor layer and a top surface of the dielectric layer;
    after removing the first liner, forming a second liner composed of a second material on the dielectric layer at the one or more sidewalls of the dual-damascene opening between the first conductor layer and the top surface of the dielectric layer; and
    forming a second conductor layer in the dual-damascene opening between the first conductor layer and the top surface of the dielectric layer,
    wherein the second material of the second liner is different in composition from the first material of the first liner, and the first liner is removed from the one or more sidewalls of the upper portion of the dual-damascene opening after filling the lower portion of the dual-damascene opening with the first conductor layer.

2. The method of claim 1 wherein the dual-damascene opening includes a via opening and a trench arranged between the top surface of the dielectric layer and the via opening, and the first conductor layer completely fills the via opening.

3. The method of claim 1 wherein the dual-damascene opening includes a via opening and a trench arranged between the top surface of the dielectric layer and the via opening, and the first conductor layer partially fills the trench.

4. The method of claim 1 wherein the first material is ruthenium.

5. The method of claim 4 wherein the second material is free of ruthenium.

6. The method of claim 4 wherein the second material is cobalt.

7. The method of claim 1 wherein a residual portion of the first conductor layer is located on the one or more sidewalls of the dual-damascene opening after the lower portion of the dual-damascene opening is filled with the first conductor layer, and further comprising:
before removing the first liner, removing the residual portion of the first conductor layer from the one or more sidewalls of the dual-damascene opening between the first conductor layer and the top surface of the dielectric layer.

8. The method of claim 1 wherein the first conductor layer is reflowed by a thermal process at an elevated temperature during the conductor deposition and reflow process.

9. The method of claim 1 wherein the first conductor layer is reflowed by a thermal process at an elevated temperature after the first conductor layer is deposited by the conductor deposition and reflow process.

10. The method of claim 1 further comprising:
forming a conductive cap layer on the second conductor layer,
wherein the conductive cap layer is comprised of cobalt.

11. A method of forming an interconnect structure, the method comprising:
forming a dual-damascene opening in a dielectric layer;
forming a first liner composed of a first material on the dielectric layer at one or more sidewalls of the dual-damascene opening;
depositing a first conductor layer by a conformal deposition process as a seed layer in a portion of the dual-damascene opening at the bottom of the dual-damascene opening, on the one or more sidewalls of the dual-damascene opening, and on a top surface of the dielectric layer;
reflowing the first conductor layer on the top surface of the dielectric layer and on the one or more sidewalls toward the bottom of the dual-damascene opening in order to increase a thickness of the first conductor layer relative to the bottom of the dual-damascene opening;
removing the first liner from the one or more sidewalls of the dual-damascene opening vertically between the first conductor layer and the top surface of the dielectric layer;
after removing the first liner, forming a second liner composed of a second material on the dielectric layer at the one or more sidewalls of the dual-damascene opening between the first conductor layer and the top surface of the dielectric layer; and
forming a second conductor layer in the dual-damascene opening between the first conductor layer and the top surface of the dielectric layer,
wherein the first conductor layer is reflowed by a thermal process at an elevated temperature during deposition, and the second material of the second liner is different in composition from the first material of the first liner.

12. The method of claim 11 wherein the dual-damascene opening includes a via opening and a trench arranged between the top surface of the dielectric layer and the via opening, and the first conductor layer completely fills the via opening.

13. The method of claim 11 wherein the dual-damascene opening includes a via opening and a trench arranged between the top surface of the dielectric layer and the via opening, and the first conductor layer partially fills the trench.

14. The method of claim 11 wherein the first material is ruthenium.

15. The method of claim 14 wherein the second material is free of ruthenium.

16. The method of claim 14 wherein the second material is cobalt.

17. The method of claim 11 wherein a residual portion of the first conductor layer is located on the one or more sidewalls of the dual-damascene opening after reflowing the first conductor layer, and further comprising:
before removing the first liner, removing the residual portion of the first conductor layer from the one or more sidewalls of the dual-damascene opening between the first conductor layer and the top surface of the dielectric layer.

18. The method of claim 11 further comprising:
forming a conductive cap layer on the second conductor layer,
wherein the conductive cap layer is comprised of cobalt.

* * * * *